(12) United States Patent
Siegel (10) Patent No.: US 6,239,782 B1
(45) Date of Patent: May 29, 2001

(54) SINGLE KNOB INTENSITY CONTROL FOR USE IN DIGITAL TEST AND MEASUREMENT EQUIPMENT

(75) Inventor: Roy I. Siegel, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/233,243

(22) Filed: Jan. 19, 1999

(51) Int. Cl.[7] ............... G09G 5/10; G09G 5/36; G06T 11/40
(52) U.S. Cl. ............... 345/147; 345/134; 345/432
(58) Field of Search ............... 345/12, 63, 67, 345/134, 147, 214, 334, 432, 442; 368/115, 116; D10/76

(56) References Cited

U.S. PATENT DOCUMENTS

| | | | |
|---|---|---|---|
| 4,940,931 | * 7/1990 | Katayama et al. | 324/121 R |
| 5,115,229 | * 5/1992 | Shalit | 345/1 |
| 5,254,983 | * 10/1993 | Long et al. | 345/147 |
| 5,387,896 | * 2/1995 | Alappat et al. | 345/147 |
| 5,440,676 | * 8/1995 | Alappat et al. | 395/143 |
| 5,483,259 | * 1/1996 | Sachs | 345/153 |
| 5,638,117 | * 6/1997 | Engeldrum et al. | 348/179 |
| 5,933,130 | * 8/1999 | Wagner | 345/147 |
| 6,057,853 | * 5/2000 | Siegel et al. | 345/432 |

* cited by examiner

Primary Examiner—Bipin Shalwala
Assistant Examiner—Jeff Piziali
(74) Attorney, Agent, or Firm—Thomas F. Lenihan (57) ABSTRACT

An apparatus and method useful in a test and measurement instrument for simultaneously adjusting both contrast and brightness via a single knob employs a family of modified gamma curves each having multiple breakpoints for mapping multiple-byte pixel intensity words into a multi-bit pixel intensity display control word. A single user-operable intensity control accomplishes selection of a particular gamma curve of the family of gamma curves, and causes the simultaneous adjustment of both contrast and brightness.

10 Claims, 5 Drawing Sheets

SINGLE KNOB INTENSITY CONTROL FOR USE IN DIGITAL TEST AND MEASUREMENT EQUIPMENT

FIELD OF THE INVENTION

The subject invention concerns control of brightness and contrast in general, and concerns control of brightness and contrast in digital test and measurement instruments, in particular.

BACKGROUND OF THE INVENTION

When one mentions "Brightness" and "Contrast" what immediately comes to mind are the familiar controls that are commonly found on television receivers. In television, a brightness adjustment changes the dc level (i.e., "offset") of the overall television signal, and changing the contrast setting causes an increase or decrease in the range between the least illuminated and most illuminated portions of the picture (i.e., "gain"). In a modern digital oscilloscope, the brightness and contrast controls produce a somewhat similar effect but operate in a very different manner on very different signals.

A brief discussion of the operation of a modern digital oscilloscope may be in order before proceeding to the subject invention. Modern digital oscilloscopes generally use raster scan displays to present the activity of electrical signals to their users. Each raster scan display, such as those seen every day on computer screens, consists of a two dimensional array of pixels, with each pixel location being uniquely defined by a row number and column number. The simplest and lowest cost versions of such displays are "single bit" displays, in that the memory from which they derive the information to be displayed only has one bit of intensity information associated with each pixel. In such a display, that single bit of information determines whether the pixel associated with it is either "on" or "off", with "on" dictating that a predetermined amount of intensity is to be used to illuminate the pixel and "off" indicating that the pixel is not to be illuminated at all.

The more complex and expensive alternative to a single bit display is a multi-bit display, which can provide variable intensity (also known as "gray-scale") or color variations as a substitute indicator of brightness. The memory locations associated with each pixel of a variable intensity display contain multiple bits of intensity information, indicating the number of varying intensity levels with which they can be illuminated. Like the pixels of single bit displays, those of multi-bit displays can exhibit an "off" or dark state, but instead of one value of illumination, they have multiple values. Typically, the number of values available is 2N–1, where N is the memory depth at each address of the raster memory. Thus, for example, a four bit deep raster scan memory can support fifteen levels of partial through maximum illumination, as well as the dark or "off" state. Pixel intensity can also be translated into differing colors, as well as intensity or "brightness".

With this larger amount of data, multi-bit displays can convey more information about the behavior of electrical signal waveforms under observation, particularly if the signal is not perfectly repetitive and therefore has less activity in some portions than others. U.S. Pat. No. 4,940,931 "Digital Waveform Measuring Apparatus Having A Shading-tone Display" (Katayama et al.) describes a system for producing digital variable intensity displays.

Typically, digital oscilloscopes acquire information about the behavior of a circuit node by periodically sampling the voltage present at the node. The oscilloscope probe tip is placed in contact with the node and the probe and front end of the oscilloscope precisely replicate the signal, or some predetermined fraction or multiple of the signal, and present it to an analog-to-digital converter. The output of the analog-to-digital converter is a series of multi-bit digital words that are stored in an acquisition memory. Successively acquired samples are stored at sequentially related addresses in the acquisition memory, and are thereby related to a time scale. Those addresses will eventually be converted back to a time scale, one of which is represented as horizontal distance along the x-axis of the oscilloscope's raster scan display.

In a typical digital oscilloscope, voltage amplitude values derived from the data contents of an acquisition memory location determine the vertical location (row number) of an illuminated pixel, while time values derived from the addresses of the acquisition memory determine the horizontal location (column number). The process of expanding the contents and addresses of an acquisition memory to produce contents for a two dimensional raster memory is known as "rasterization".

The output of a rasterization process is usually combined with some preexisting content of a raster memory, and the resulting composite raster contents may thereafter be regularly subjected to some sort of decay process. Digital persistence and decay are known, for example, from U.S. Pat. No. 5,440,676 "Raster Scan Waveform Display Rasterizer With Pixel Intensity Gradation" (Alappat, et al.), U.S. Pat. No. 5,387,896 "Rasterscan Display With Adaptive Decay" (Alappat, et al.), and U.S. Pat. No. 5,254,983 "Digitally Synthesized Gray Scale For Raster Scan Oscilloscope Displays" (Long, et al.).

The result of the above described process is a raster memory comprising memory locations each of which contains a multibit digital word representative of the desired illumination of a corresponding pixel of the display.

U.S. patent application Ser. No. 09/056,042, "BITS-PER-PIXEL REDUCTION FROM VARIABLE INTENSITY RASTERIZER TO VARIABLE INTENSITY OR COLOR DISPLAY" (Siegel, et al.), filed Apr. 3, 1998 and assigned to the same assignee as the present application, discloses the operation of contrast and brightness controls in an oscilloscope such as the one described above. In accordance with that invention the bits-per-pixel values are decreased under control that permits the operator to choose the gain and offset of the transfer function. From the user's point of view such controls appear, respectively, as contrast and brightness adjustments. It is disclosed in that document that a 21-bit pixel intensity value be mapped into a 4 bit pixel intensity display word by comparing the 21-bit value against a series of breakpoints, and setting the 4 bits of the pixel intensity display word accordingly. It is further disclosed in that reference that, in one embodiment, the maximum pixel intensity value can be set via a brightness control.

The TDS-7xxD series oscilloscopes manufactured by Tektronix Inc. are actual oscilloscopes embodying the teaching of Siegel, et al. In the TDS-7xxD the contrast and brightness functions are controlled via a single knob which is assigned to each function by means of a menu choice. From the user's point of view, control of these functions is essentially the same as having two knobs, one for brightness and one for contrast. Operation of these controls will be explained below in comparison to the operation of the subject invention.

While this arrangement performs adequately, it is felt that the alternate use of the same knob for the two different functions may lead to some consumer confusion, especially since the contrast and brightness functions are somewhat interactive, as will be explained below. Also, for reasons to be explained below, it was found that when the display was switched from color to black and white, or vice versa, that the contrast and brightness settings had to be readjusted.

What is needed is an apparatus and method for quickly and easily controlling both brightness and contrast simultaneously via a single knob, producing an output which makes good use of the dynamic range available, and causing that setting to behave in an equivalent manner in both black and white and color modes of operation.

SUMMARY OF THE INVENTION

An apparatus and method useful in a test and measurement instrument for simultaneously adjusting both contrast and brightness via a single knob employs a family of modified gamma curves each having multiple breakpoints for mapping multiple-byte pixel intensity words into a multi-bit pixel intensity display control word. A single user-operable intensity control accomplishes selection of a particular gamma curve of the family of gamma curves, and causes the simultaneous adjustment of both contrast and brightness.

DETAILED DESCRIPTION OF THE EMBODIMENT

It is well known in the television and video display arts that there is a non-linear relationship between a particular pixel intensity value and the actual illumination produced at that pixel on a display device. In order to correct for that non-linearity, the pixel intensity information is generally corrected by application of a gamma correction factor. Gamma curves are well-known correction curves employing the general equation $y=x^{gamma}$ In order to avoid confusion with this well-known concept, it should be noted at the outset that the subject application is not employing the gamma function for its normal display-correction use, but rather for a totally different purpose. That totally different purpose is to develop a family of curves for use in a digital oscilloscope or the like that allow single knob control of both contrast and brightness simultaneously, and with good use of the available dynamic range.

Figure 1:
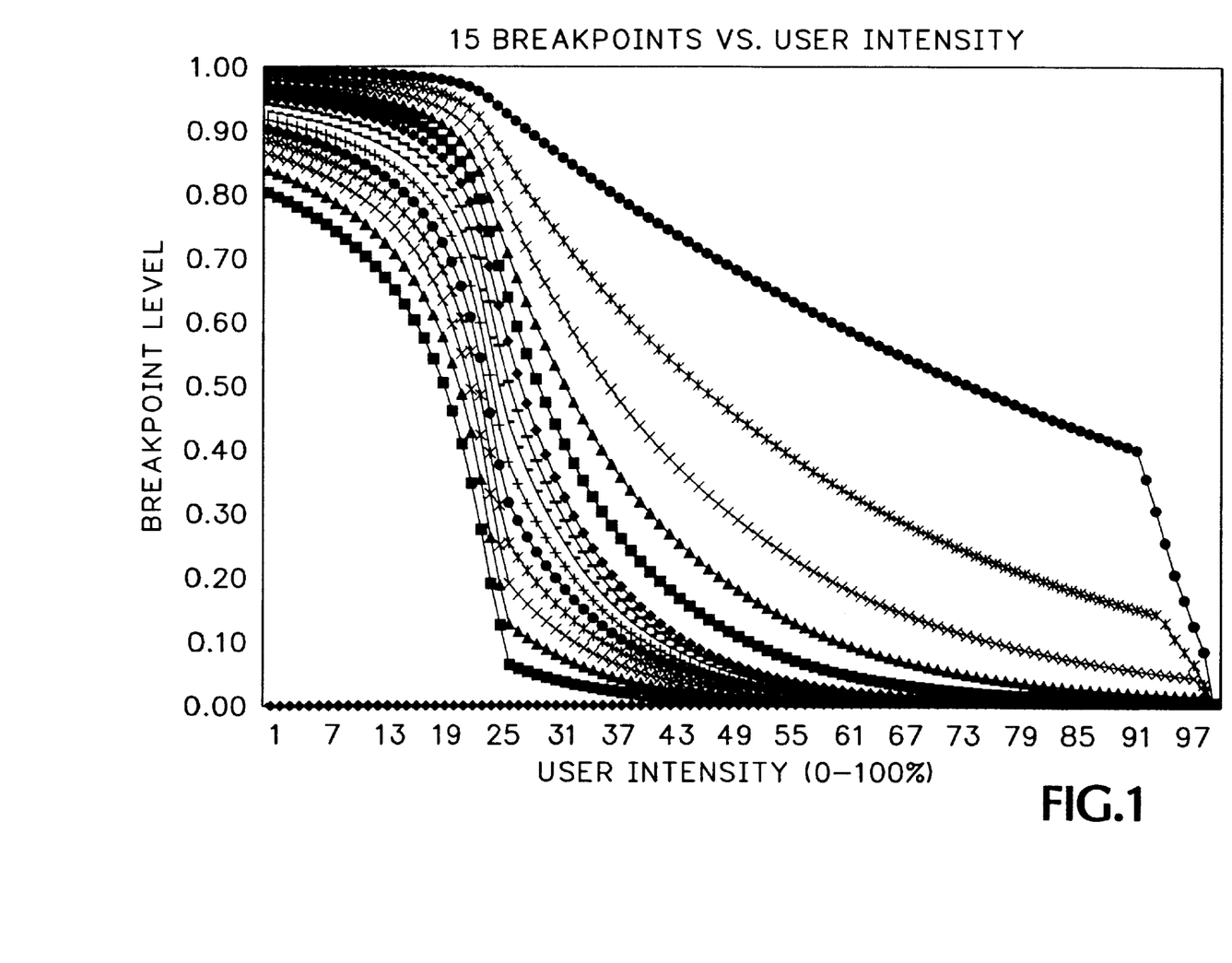
FIG. 1 shows a family of 15 modified gamma curves having 100 intensity values in accordance with one aspect of the invention.
Figure 2:
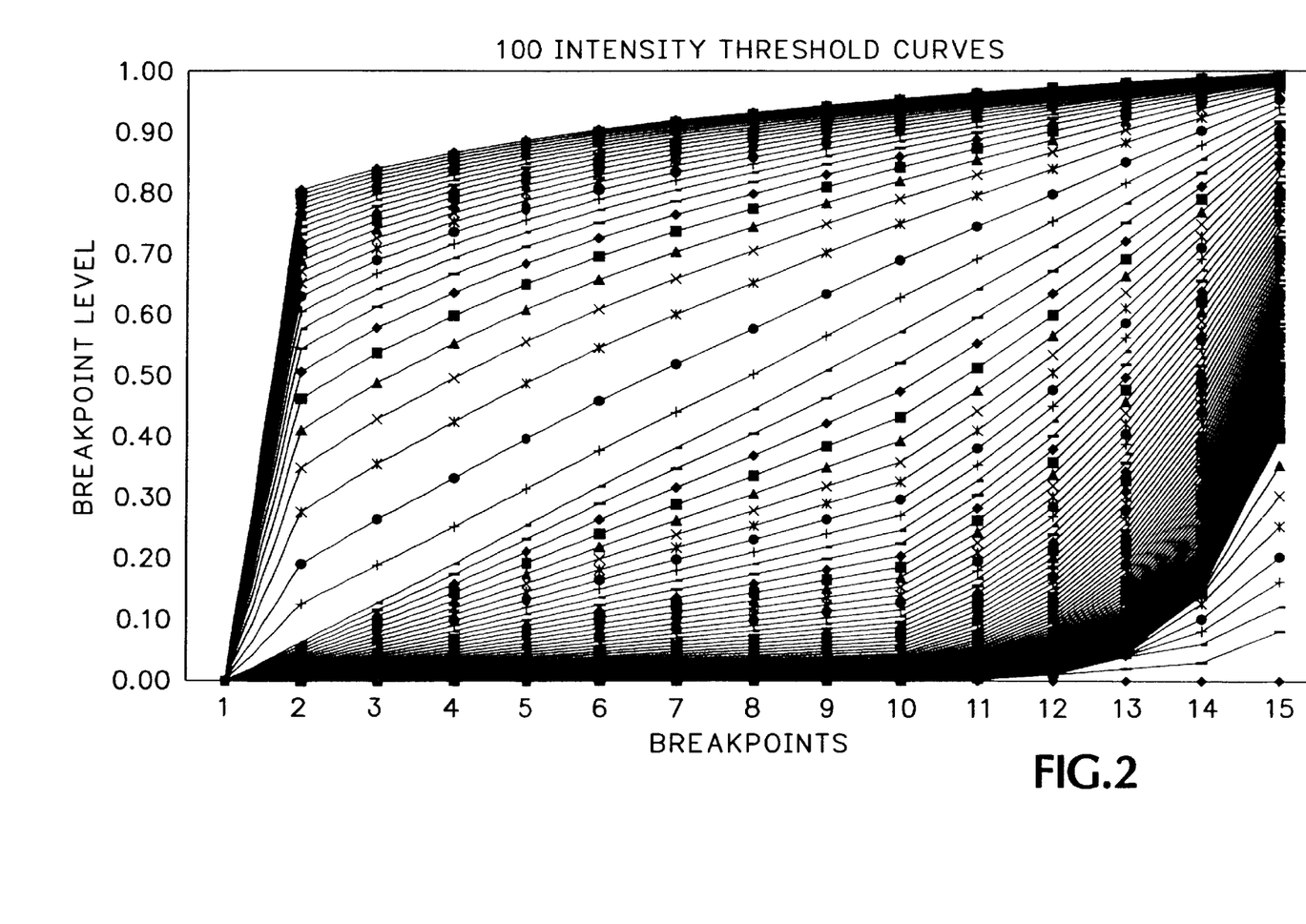
FIG. 2 shows a family of 100 modified gamma curves having 15 breakpoint in accordance with a second aspect of the invention.

A first attempt at a solution to the problems noted above was to map the intensity data to the display by using a family of standard gamma curves (i.e., of the form $y=x^{gamma}$). Unfortunately, the results were unsatisfactory, and experts in the field who observed the work suggested that an approach based on the use of gamma curves simply would not work. Nevertheless, the subject inventor refused to abandon this line of endeavor, and instead realized that a modified set of gamma curves could be made to perform satisfactorily, if designed properly. FIGS. 1 and 2 are illustrations of such a family of modified gamma curves, each based on the same data, but graphed from different perspectives Key to the successful modification of the gamma curves were the following realizations.

The first breakpoint on every curve should be set to zero.

The input to output transfer functions should be divided into two regions, with linear mapping (i.e., y=mx) being the boundary between the two. Rather than an equal division of the regions, it was decided to allocate 75% of the controllability to the brighter settings (i.e., those curves below the y=mx curve of FIG. 2), and 25% to the darker settings (i.e., those curves above the y=mx curve of FIG. 2).

For the darker settings the following formula is used:

$y=mx^{1/(b \cdot (d-G/n)}$ where b, d, m, n are constants, and G is a function of user controlled input intensity. (EQ 1)

For the brighter settings the following formula is used:

$y=mx^{b \cdot (G-d)/n}$ where b, d, m, n are constants, and G is a function of user controlled input intensity. (EQ 2)

The above-noted constants are adjusted for wide dynamic range utilization, and so that the linear curve y=mx dividing the two regions represents a reasonable midpoint between the two sets of curves.

A curve is created at the highest intensity that exhibits zero values for any input, to cause any accumulated intensity to get full intensity or color. That is any intensity will exceed the zero threshold and produce a full brightness display.

Because bright gamma curves with good curvature cause lower breakpoint values to map very closely to zero, a significantly better use of dynamic range occurs by creating linear mappings for the bottom $2/3$ of these gamma curves.

Finally, it is herein recognized that a jump from the brightest gamma curve to the "zero values" curve causes a jump in intensity, the top values of the brightest gamma curves should be changed to approximately linearly cover this gap.

FIG. 1 may be the best FIGURE to start with in order to easily understand the subject invention. Referring to FIG. 1, a family of fifteen curves is illustrated. Each curve represents a set of breakpoints for mapping 100 input pixel intensity values into a percentage of full scale of a total intensity value. Thus the output of this process is a percentage multiplication factor. One might expect the output value to represent a pixel intensity directly. However, the percentage multiplier produced by this process, is multiplied against a Full Scale Brightness value which itself is not a constant, but rather is subject to varying in accordance with other oscilloscope settings.

To understand operation in accordance with FIG. 1, note that all of the breakpoint curves are closely grouped together at the upper left portion of the graph. Thus, the transfer functions illustrated by the graph tend to produce dark screen values to the left of the graph, and bright screen values toward the right side of the graph. In this regard, it is important to note that at the left side of the graph, the lowest breakpoint curve is set such that the input signal must exceed 80% of the available range before an output signal for illuminating a pixel will be produced.

Referring now to FIG. 2, the same data is displayed in a different form, that is 100 curves having 15 breakpoints per curve. Note that in FIG. 2, higher curves on the graph produce dimmer displays. This is because the breakpoints (or thresholds) are set so high that most of the input pixel intensity signal will not exceed them. Consequently, only low level output pixel intensity data will be produced. Use of the uppermost curve maps the intensity data to be displayed with the least brightness and low contrast (i.e., as shown by the gentle slope of the curve). The second lowest curve of the graph maps the intensity data to be displayed with high brightness, but again with low contrast. The lowest curve is one which will produce maximum brightness for any level of input signal intensity. As noted above, it is herein recognized that because a jump from the brightest gamma curve to the "zero values" curve causes a jump in intensity, the top values of the brightest gamma curves have been changed to approximately linearly cover this gap, as shown by the 7 curves in the lower right portion of FIG. 2.

The linear mapping (y=mx) curve, labelled 210, divides the graph into two sections, with most (approximately 75%) of the controllability allocated to the brighter settings, and 25% allocated to the darker settings. This feature is also exhibited in FIG. 1 in the area of the graph extending from about 25% of full brightness to 100% of full brightness. With respect to FIG. 2, a user selects a set of breakpoints from a particular curve by operating the above-mentioned single intensity control knob.

Note that by making such a selection, the user is selecting both an offset (i.e., brightness) value, and a particular contrast (i.e., gain, slope) setting, at the same time. In the prior art versions of the TDS-7xxD oscilloscope mentioned above, these settings were made sequentially and iteratively. In that prior art system there were 25 brightness curves and 25 contrast curves for each brightness setting. In order to visualize how that system operates, consider any given curve of FIG. 2. In that prior art system, a user might select a brightness level first, and thereafter alter the slope of the line around that point by rotating the contrast control knob. (Alternatively, a user might select a contrast level first, and thereafter alter the offset of the line from that point by rotating the brightness control knob). Unfortunately, the user received no guidance as to which of these possible selections might provide the best use of the available dynamic range, and had to rely on his perception of what "looked good" on the screen.

In the particular case wherein color rather than illumination level is used to indicate relative recurrence of the a particular hit on a given pixel, good use of dynamic range translates to use of a rainbow of colors in the display. That is, a color representation of a low contrast signal would use only a few colors, whereas color representation of a high contrast signal would make use of a greater range of colors. In the prior art system described above, a particular arbitrary setting that "looked good" to a user in the monochrome (black and white) display might use very few colors in a color display, necessitating a readjustment of both the brightness and contrast knobs. It has been found that use of the present invention allows switching between color and monochrome displays without having to readjust the single knob intensity control.

Figure 3A:
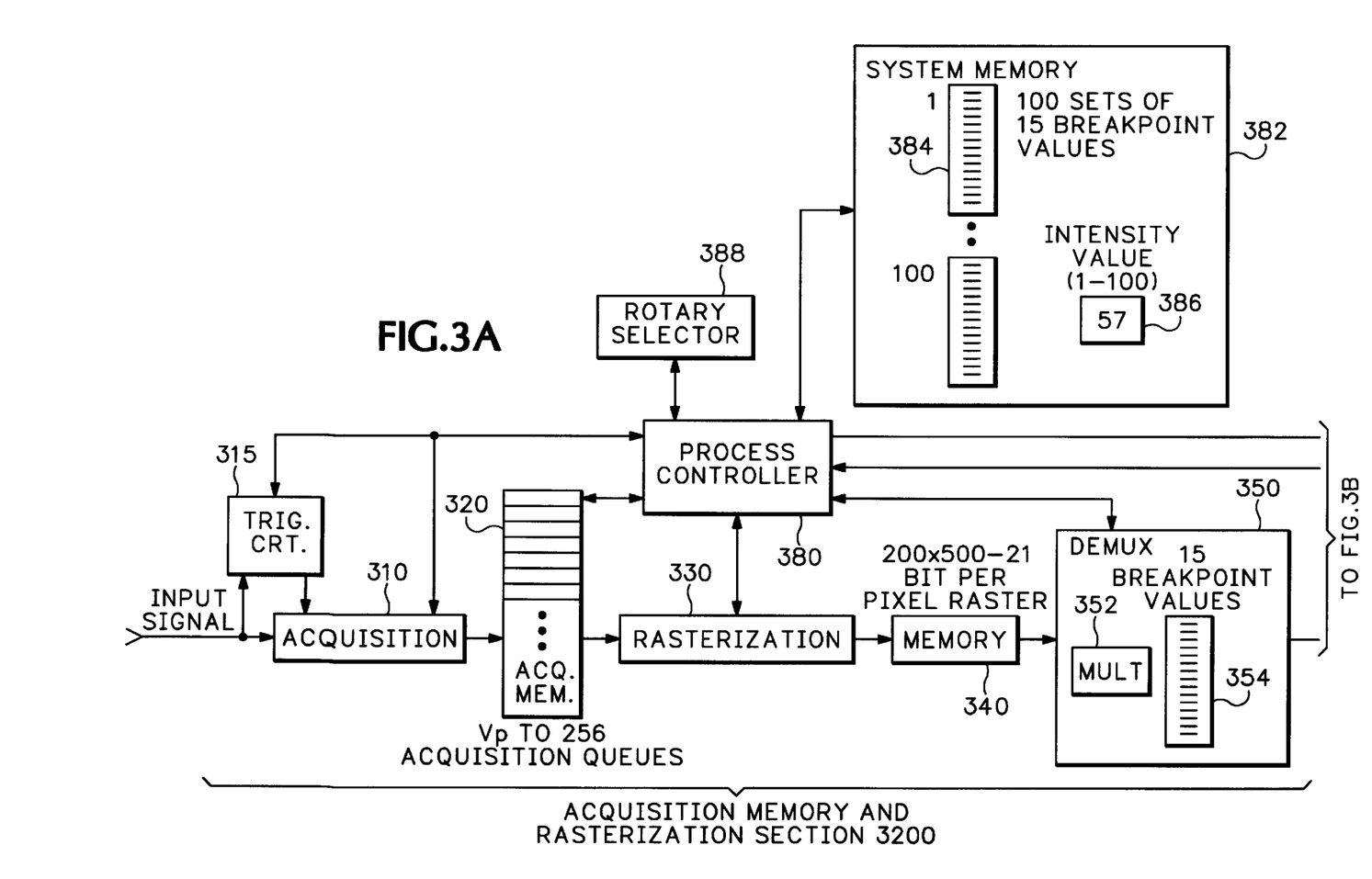
FIG. 3 shows circuitry in accordance with the invention.
Figure 3B:
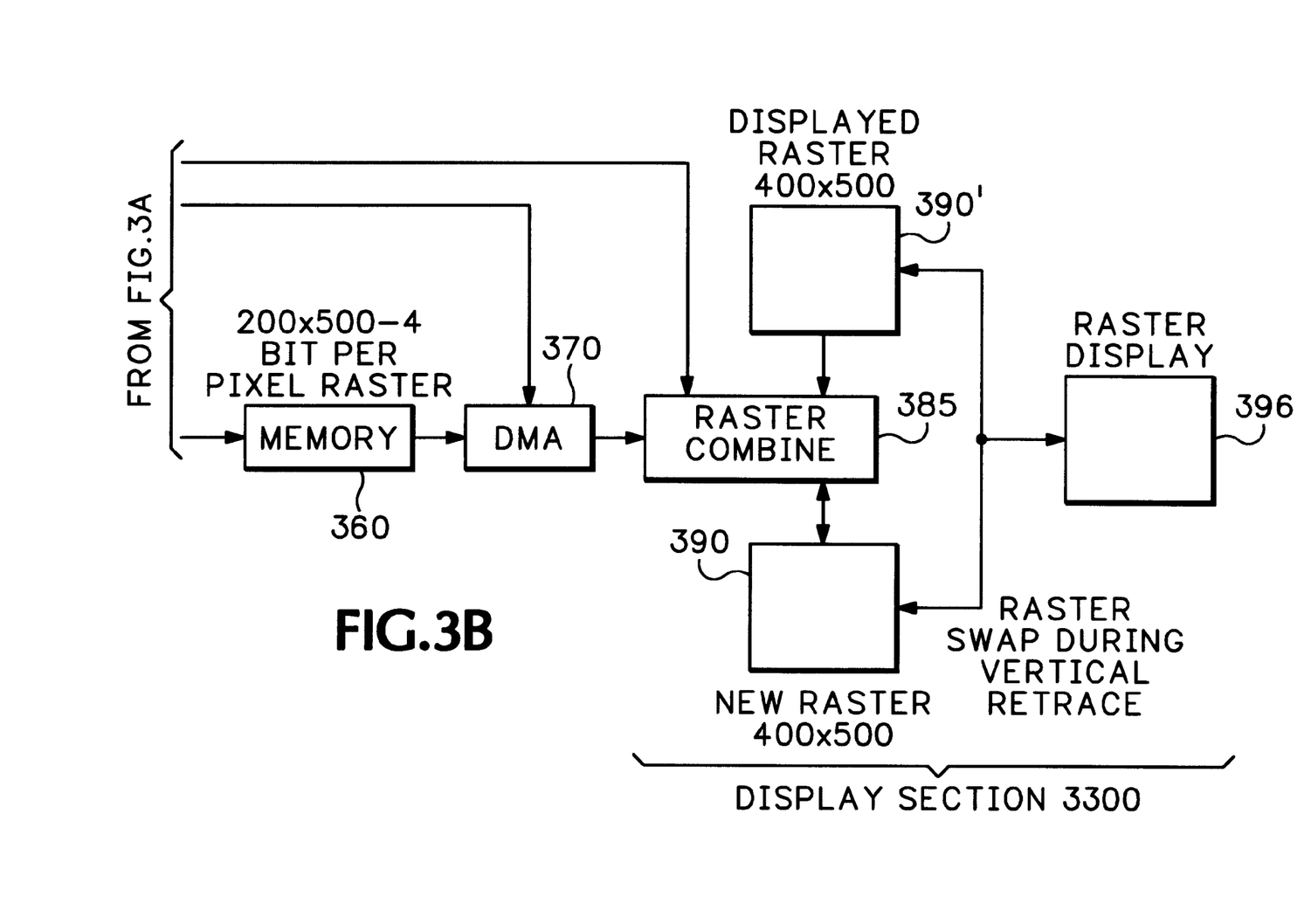

The curves of FIGS. 1 and 2 translate to 100 sets of 15 breakpoints for use in the circuitry of FIG. 3, and produce a percentage value for multiplication of the above-mentioned Full Scale Brightness value. The Full Scale Brightness value may be either a theoretical (but still setting-dependent) maximum value or an actual measurement called Max Pix Value, depending upon which of two operating modes are selected. If a mode known as AutoBright is "on" (i.e., active) then the value chosen uses the actual measurement value Max Pix Value. In this mode, the maximum available is assigned to the highest actual count of hits on a pixel. If, on the other hand, AutoBright is "off" (i.e., inactive), then the theoretical setting-dependent maximum value is used. In passing it is noted that modified gamma curves of the subject invention could be used to directly select the actual display pixel intensity values desired, rather than producing a percentage multiplier. However, to do so would require computing and storing all possible values for use with both the AutoBright Mode "on" and "off", and storing all of those possible values for later retrieval and use. Such an arrangement was felt to be undesirable.

Referring to FIG. 3, we see a simplified block diagram of the flow of acquired data as it moves through the acquisition memory and rasterization section 3200 and into the display section 3300 of an oscilloscope according to the present invention. Vertical scaling and vertical offset functions are applied prior to digitizing, and are therefore not directly visible in this figure, but rather are part of the acquisition process 310. The trigger circuitry 315, under the direction of the process controller 380, monitors the input signal and other criteria (not shown) and communicates the occurrence of the satisfaction of the trigger conditions to the acquisition circuitry 310 and the process controller 380.

Process controller 380 contains timers and state machines that allow it to control all of the acquisition and rasterization process, including some of the optional processes that will be discussed below and are not shown in FIG. 3. As can be seen, it sends command and information to, and receives various signals from, almost every part of the acquisition memory and rasterization section 3200 as well the trigger 315 and acquisition circuitry 310. It notifies the raster combiner 385 when data is ready. The process controller 380 monitors the trigger circuitry 315 and starts the acquisition circuitry 310 and the rasterizer 330 at appropriate times, i.e., when there are enough acquisitions to rasterize or else so much time has elapsed from the first trigger or the last display update that new data is due at the display 396.

When data is due at the display 396, the process controller 380 starts the intensity mapping 350 and subsequently the DMA circuitry 370. As will be discussed in more detail below, the process controller 380 also determines when acquisition aborts are necessary, causes a trigger position calculator to run, and computes breakpoints.

As the output of the acquisition process 310, voltage-versus-time data-address pairs are stored in an acquisition memory 320. Acquisition memory 320 can hold two waveform records that are up to 512K samples long, or may be partitioned to hold up to 256 shorter waveform records each containing 768 samples. Each sample location contains 8 bits of information defining one of 256 possible voltage amplitude levels. 200 of these voltage amplitude levels correspond to one of the 200 pixel locations in each column of the 21-bit-per-pixel 200×500 acquisition raster memory 340.

Each acquisition memory and rasterization section 3200 can acquire 100,000 waveform records per second, with each record containing 500 data points, and with each data point acquired at 1ns intervals, for a total of 500 ns per acquisition. Multiple acquisition memory and rasterization sections 3200, specifically two or four, can be interleaved together to double or quadruple the overall throughput available on one oscilloscope channel. The raster combiner 380 of the display section 3300 can multiplex the outputs of these multiple acquisition memory and rasterization sections 320 back together in the display section 3300.

The raster combiner 380 can also be made to translate intensity variations into color variations, with appropriate supportive changes being made in the display raster memories, 390 and 390', and the raster display 396, if needed. Process controller 380 also communicates with a system memory module 382 having an array of 100 multibit memory locations 384 containing 100 sets of 15 breakpoint values in accordance with FIGS. 1 and 2. System Memory module 382 also includes a memory location 386 for holding the value of a pointer identifying which of breakpoints 1–100 is currently selected.

The contents of 200×500 21-bit-per-pixel acquisition raster memory 340 is then "mapped" 350 into a second, shorter depth, 4-bit-per-pixel acquisition raster memory 360 having the same planar (200×500) dimensions. This shorter 4-bit-per-pixel acquisition raster memory 360 still contains 200× 500 pixel locations, but each pixel only has 4-bits-per-pixel of intensity information associated with it, and consequently can only display 16 levels of intensity. This "mapping" 350 is accomplished by the use of 15 breakpoints that (monotonically) define the boundaries of the 16 intensity levels.

In operation, process controller 380 selects a particular set of breakpoints from the group of 100 sets of breakpoints in response to the setting of a rotary Intensity Control knob 388.

Figure 4:
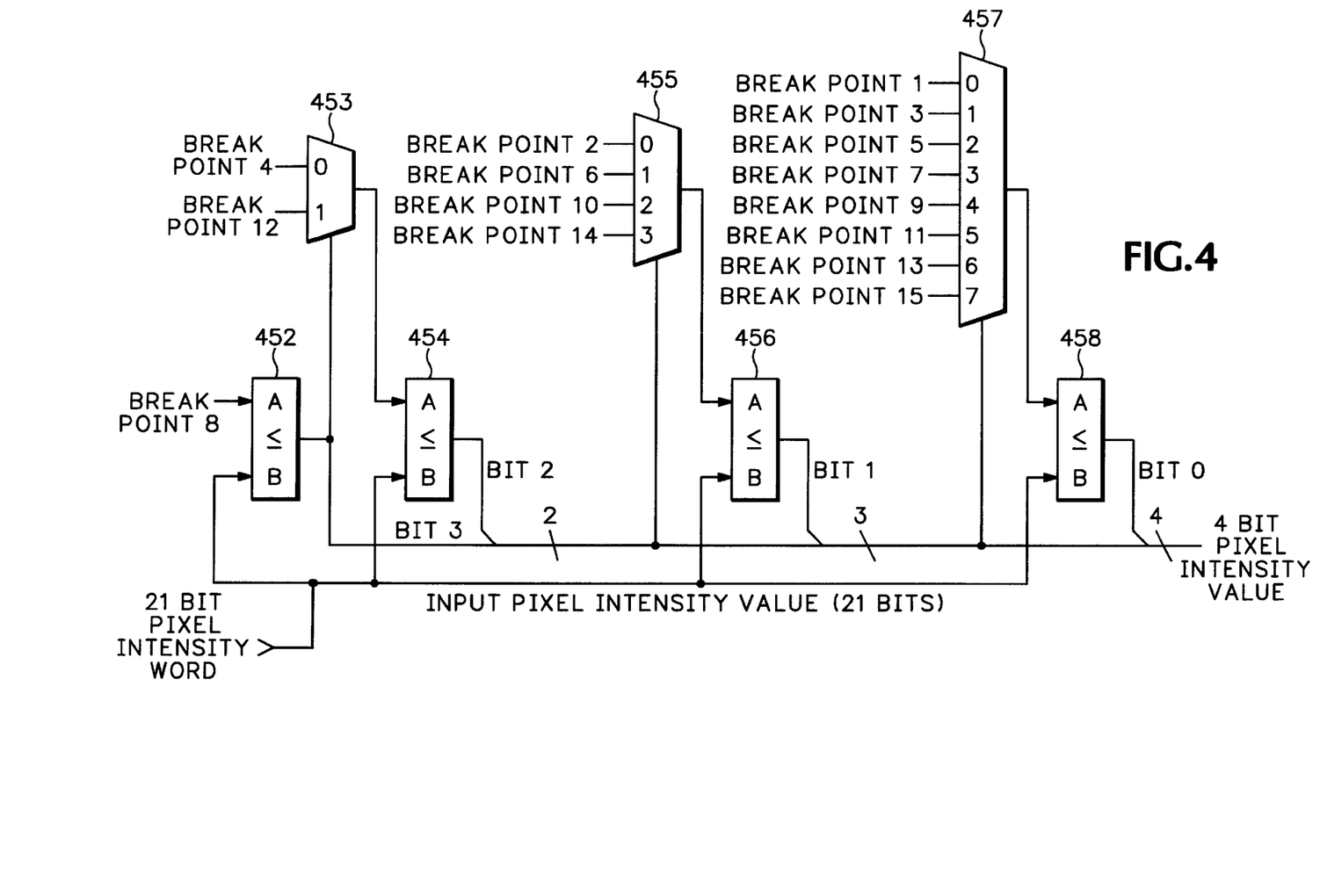
FIG. 4 is a schematic diagram of the intensity mapper circuit for accomplishing bitper-pixel reduction in a manner according to the present invention.

Referring now to FIG. 4, the intensity mapping process 350 is controlled by break point values. FIG. 4 shows how these break points are used in the intensity mapper circuit to accomplish bit-per-pixel reduction in a desired manner. The assignment of 15 break point values determines the boundaries of the 16 intensity levels that will be produced by the 4-bit-per-pixel mapping.

The circuitry shown in FIG. 4 operates as a successive approximation digitizer as it reduces the bit count of the pixels from 21 to 4. The breakpoint values are multiplied in multiplier 352 of FIG. 3 by the percentage factor determined by the particular curve selected from the graph of FIG. 2 to generate modified breakpoint values. The input pixel intensity value is compared 452 with modified BreakPoint 8. If the input pixel intensity value is larger than the value of modified BreakPoint 8, Bit 3 (the MSB) of the mapped-to 4-bit pixel intensity value will be one. Conversely, if the input pixel intensity value is smaller than the value of modified BreakPoint 8, Bit 3 (the MSB) of the mapped-to 4-bit pixel intensity value will be zero. In similar fashion, the input pixel intensity value is compared 454 with either modified Break Point 4 or modified Break Point 12 of the input pixel intensity value range to determine Bit 2 of the mapped-to 4-bit pixel intensity value. The selection of BreakPoint 4 or BreakPoint 12 for comparison depends on which output of multiplexer 453 is selected by the outcome of the previous comparison 452.

Similarly, the results of the first two comparisons 452,454 select which output of multiplexer 455 the input pixel intensity value is to be compared 456 with, Break Point 2, 6, 10, or 14. The result of this comparison 456 is Bit 1 of the mapped-to 4-bit intensity value. This process is repeated one additional time, with the output of multiplexer 457 being one of Break Points 1, 3, 5, 7, 9, 11, 13, or 15, depending on the outcome of the first three comparisons 452,454,456, and with that output being compared 458 with the input pixel intensity value to determine the state of Bit 0. The output of this process, which can also be characterized as a binary search to locate mapped-to bins, is the 4-bit pixel intensity value.

What has been described is an intuitive and user-friendly system for simultaneously adjusting both contrast and brightness with a single control, and also exhibiting good use of the available dynamic range thereby permitting the same setting to be used in both color and monochrome modes of operation.

The term "process controller" as applied to element 380 is intended to include a microcomputer, or a microprocessor, and is also intended to encompass other forms of controllers such as dedicated hardware controllers including ASICs.

The term "selector" as used herein refers to any control operable by a user to select a function. The term "selector" is intended to include physical keys, softkeys, touch screens, rotary selectors, and menu driven systems.

While the invention has been described with respect to a digital oscilloscope, it is herein recognized that it would is also applicable to other types of test and measurement equipment, such as spectrum analyzers, logic analyzers, and the like, and such modification is deemed to lie within the scope of the following claims.

What is claimed is:

1. A method for simultaneously adjusting brightness and contrast in digital test and measurement equipment, the method comprising the steps of:

setting a maximum pixel reference value;

forming a family of curves, each of said curves comprising a set of breakpoint values for comparison with an input data signal representative of input pixel intensity values, each of said curves exhibiting a different offset and gain characteristic;

selecting one of said family of curves in response to user input;

using said break point values of said selected curve to generate pixel intensity percentage values;

multiplying said breakpoint values by said percentage values to generate modified breakpoint values; and comparing input pixel intensity values to said modified breakpoint to produce output pixel intensity values for display on a display means.

2. The method for simultaneously adjusting brightness and contrast according to claim 1 wherein the setting step comprises the steps of:

permitting an operator to choose between a first mode and a second mode; and while in the first mode, making said maximum pixel reference value a function of the actual largest pixel intensity value; and while in the second mode, making said maximum pixel reference value a function of an amount of time that intensity data has been accumulating into an acquisition raster memory containing the input pixel intensity values.

3. The method for simultaneously adjusting brightness and contrast according to claim 2 wherein, while in said second mode, said maximum pixel reference value is additionally a function of the ratio of the actual largest pixel intensity value to the theoretical maximum pixel intensity value.

4. The method for simultaneously adjusting brightness and contrast according to claim 1 wherein the setting step comprises the steps of:

permitting an operator to choose between a first mode and a second mode; and while in the first mode, making the maximum pixel reference value a function of the actual intensity value of the largest input pixel intensity value; and while in the second mode, making the maximum pixel reference value a function of some factor other than the actual intensity value of the largest input pixel intensity value.

5. The method for simultaneously adjusting brightness and contrast according to claim 1 wherein the forming step comprises the step of further modifying those curve corresponding to the highest brightness to decrease an observable objectionable change in intensity when changing between the highest brightness curve and an adjacent curve.

6. The method for simultaneously adjusting brightness and contrast according to claim 1 wherein the step of forming comprises providing a curve in which a digital signal exhibiting any input level will produce the highest brightness display in a corresponding pixel.

7. The method for simultaneously adjusting brightness and contrast according to claim 6 wherein the step of forming includes the step of setting a first breakpoint in every curve to a value of zero.

8. The method for simultaneously adjusting brightness and contrast according to claim 7 wherein said family of curves is partitioned into first and second portions disposed about a substantially linear curve of the form y=mx;

said first portion being disposed above said substantially linear curve and exhibiting the form $y=mx^{1/(b^*(d-G/n))}$ where b, d, m, n are constants, and G is a function of user controlled input intensity;

said second portion being disposed below said substantially linear curve and exhibiting the form $y=mx^{b^*(G-d/n)}$ where b, d, m, n are constants, and G is a function of user controlled input intensity.

9. The method for simultaneously adjusting brightness and contrast according to claim 8 wherein said curves of said second portion of curves exhibit substantially linear behavior beginning at zero and extending for substantially ⅔ of their respective excursions.

10. Apparatus for use in digital test and measurement equipment for simultaneously adjusting brightness and contrast of displayed pixel data, comprising:

a controller for setting a maximum pixel reference value;

a memory, coupled to said controller, for storing a family of curves, each of said curves comprising a set of breakpoint values for comparison with an input data signal representative of input pixel intensity values, each of said curves exhibiting a different offset and gain characteristic;

a selector for selecting one of said family of curves in response to user input;

said controller using said break point values of said selected curve to generate pixel intensity percentage values;

circuitry for multiplying said breakpoint values by said percentage values to generate modified breakpoint values; and circuitry for comparing input pixel intensity values to said modified breakpoint to produce output pixel intensity values for display on a display means.

* * * * *